United States Patent [19]

Karlsson

[11] Patent Number: 5,781,425
[45] Date of Patent: Jul. 14, 1998

[54] METHOD AND DEVICE FOR CONTROL OF A CONVERTER INSTALLATION

[75] Inventor: Torbjörn Karlsson, Ludvika, Sweden

[73] Assignee: Asea Brown Boveri AB, Västerås, Sweden

[21] Appl. No.: 823,763

[22] Filed: Mar. 25, 1997

[30] Foreign Application Priority Data

Mar. 26, 1996 [SE] Sweden .................................. 9601146

[51] Int. Cl.⁶ ...................................................... H02H 7/00
[52] U.S. Cl. ............................. 363/51; 363/35; 323/207
[58] Field of Search ............................ 363/50, 51, 52, 363/55, 56, 35; 323/205, 207; 361/18, 78, 107, 111, 117, 93

[56] References Cited

U.S. PATENT DOCUMENTS

| | | | |
|---|---|---|---|
| 4,594,634 | 6/1986 | Schminke | 361/93 |
| 4,685,044 | 8/1987 | Weibelzahl et al. | 363/51 |
| 4,689,733 | 8/1987 | Guth et al. | 363/51 |
| 4,888,674 | 12/1989 | Weibelzahl et al. | 363/35 |
| 4,916,377 | 4/1990 | Terada et al. | 323/210 |
| 5,272,617 | 12/1993 | Nakamura | 363/51 |
| 5,371,664 | 12/1994 | Seki | 363/51 |
| 5,592,369 | 1/1997 | Bjorklund | 363/51 |
| 5,694,306 | 12/1997 | Bjorklund et al. | 363/35 |
| 5,701,241 | 12/1997 | Dofnas et al. | 363/35 |
| 5,717,580 | 2/1998 | Karlecik-Maier | 363/35 |

OTHER PUBLICATIONS

Patent Abstracts of Japan, vol. 16, No. 318, 4–91623, Takashi Kuwabara, DC Transmission System, Mar. 1992.
Ekstrom, High Power Electronics HVDC and SVC, Jun. 1990, pp. 4–22-7-35.

*Primary Examiner*—Adolf Berhane
*Attorney, Agent, or Firm*—Pollock, Vande Sande & Priddy

[57] ABSTRACT

The invention relates to the determination of short-circuit power (SCC1, SCC2) in an electric power network (N1, N2) for alternating current, which at a connection point (J1, J2) is connected to a converter installation (PL) for transmission of high-voltage direct current. A converter (SR1, SR2) comprised in the converter installation operates with a control angle ($\alpha 1$, $\alpha 2$). Power values ($MQ(t'_0)$), ($MQ(t'_k)$, $MQ(t'_n)$) of reactive power (Q1, Q2) consumed by the converter and voltage values ($MU(t'_0)$), ($MU(t'_k)$, $MU(t'_n)$) of the voltage (U1, U2) of the power network, sensed at the connection point, are formed and stored at a first calculating time ($t'_0$) and at least one second calculating time ($t'_k$, $t'_n$). During a measurement interval (t1–t2) which at least partly coincides with the calculating interval ($t'_0$-$t'_n$), the control angle ($\alpha 1$, $\alpha 2$) of the converter is given a control-angle addition ($\Delta\alpha 1$, $\Delta\alpha 2$). A power difference ($\Delta Q'_k$) is formed in dependence on the difference of the respective power values, and a voltage difference ($\Delta U'_k$) is formed in dependence on the difference of the respective voltage values. A measured value (MSSC1, MSSC2) of the short-circuit power of the power network is formed in dependence on the power difference and the first voltage difference.

14 Claims, 4 Drawing Sheets

METHOD AND DEVICE FOR CONTROL OF A CONVERTER INSTALLATION

TECHNICAL FIELD

The present invention relates to a method for control of a converter installation according to the preamble to claim 1, and to a device for carrying out the method.

BACKGROUND ART

Knowledge about the short-circuit power of an electric network is essential for dimensioning components included in the power network but also for the operation of the power network and of installations connected thereto. For example, during operation of a converter installation for transmission of high-voltage direct current, certain operating parameters are determined by the short-circuit powers for the power networks for alternating current, to which the installation is connected. These short-circuit powers put an upper limit to the power that can be transmitted via the dc transmission. In particular the converter operating in inverter operation is, for its mode of operation, sensitive to voltage reductions in the power network for alternating current to which it is connected, voltage reductions whose amplitude is determined by the short-circuit power of the power network.

For a general description of converter installations for transmission of high-voltage direct current, see for example Åke Ekström: High Power Electronics HVDC and SVC, Stockholm June 1990, in particular chapter 4, pages 4–22 to 4–32 and chapter 7, page 7-1 to 7-35.

Converter installations of the above-mentioned kind usually comprise filters for harmonic filtering and for generation of reactive power, connected to the alternating-voltage side of the converters. In connection with switchings of these filters, jumps in the voltage also occur, the amplitude of which is determined by the short-circuit power of the ac networks. Systems have therefore been developed which, by adaptation of the control angles of the converters before and in connection with the switching, minimize the voltage jumps.

One problem in connection with the operation of converter installations of this kind is that, because of switchings between different operating positions in the ac networks, the short-circuit powers thereof varies with time. Although the short-circuit power per se can be calculated for all the operating positions, however, the information about these is not always available to the operator of the converter installation, or for automatic setting of the operating parameters thereof.

SUMMARY OF THE INVENTION

The object of the invention is to provide a method of the kind described in the introductory part of the description, which allows the relevant short-circuit power of the ac power network to be continuously determined by a method of measurement by way of the converter installation, and a device for carrying out the method.

What characterizes a device according to the invention will become clear from the appended claims.

Advantageous improvements of the invention will become clear from the following description and claims.

BRIEF DESCRIPTION OF THE DRAWINGS

The invention will be explained in greater detail by description of embodiments with reference to the accompanying drawings, wherein FIG. 1 schematically shows, in the form of a single-line diagram, a converter installation for transmission of high-voltage direct current, connected between two power networks for alternating current.

DESCRIPTION OF THE PREFERRED EMBODIMENTS

The following description relates both to the method and to the device, and the figures may be viewed both as signal-flow diagrams and as block diagram of devices. The expressions "calculating value" and "signal" are therefore used synonymously.

Figure 1:
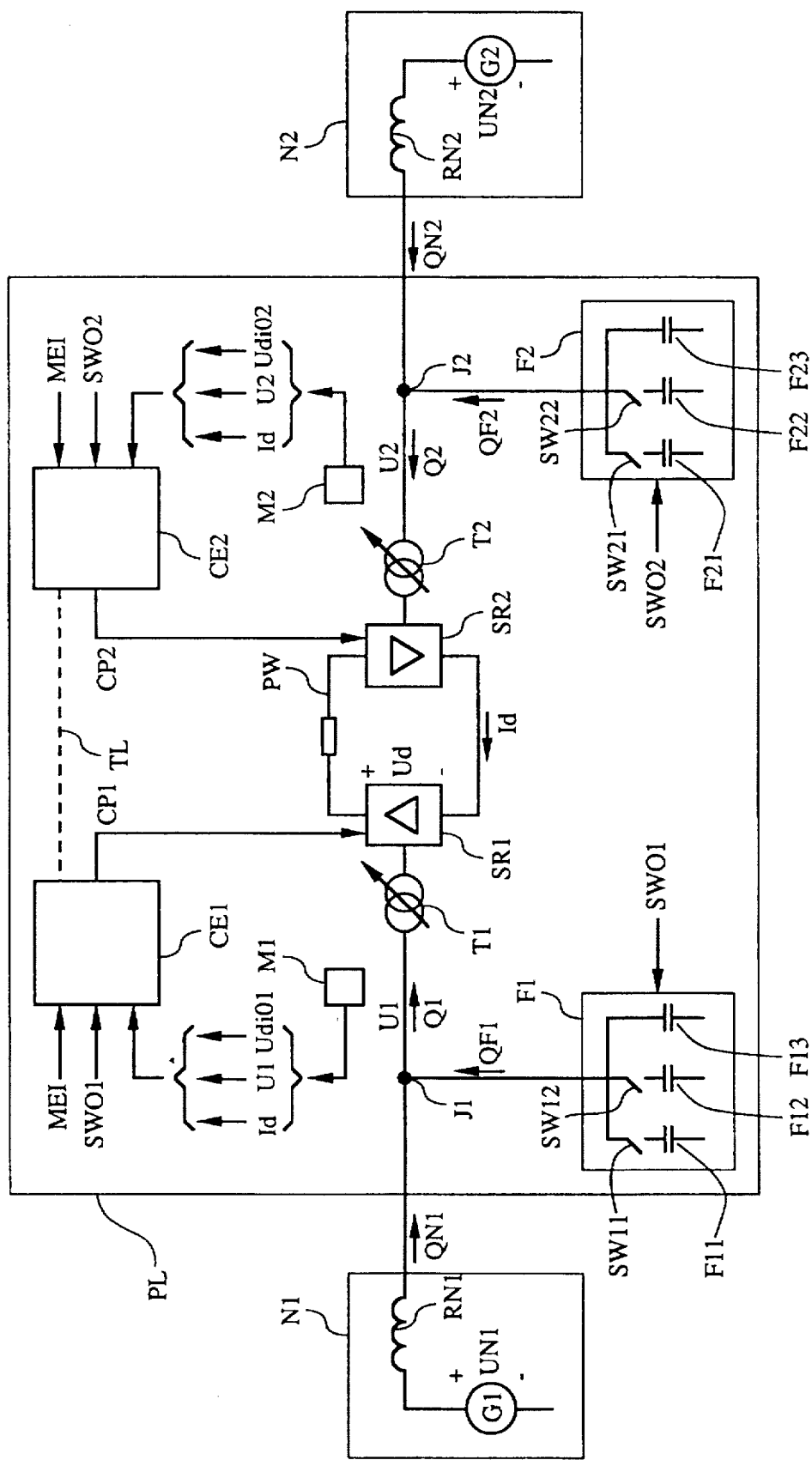

FIG. 1 shows a first electric power network N1 for three-phase alternating current with the angular frequency $\omega1$, which at a first connection point J1 is connected to a converter installation PL for transmission of high-voltage direct current and a second electrical power network N2 for three-phase alternating current with the angular frequency $\omega2$, which at a second connection point J2 is connected to the installation PL. The impedance of the power network N1 is symbolized by a first reactance element RN1 with the inductance L1 and its voltage sources by a first generator G1 with the voltage UN1. The impedance and the internal voltage sources, respectively, of the power network N2 are symbolized by a second reactance element RN2 with the inductance L2 and a second generator GN2 with the voltage UN2.

The installation PL comprises a first converter transformer T1, connected on its primary side to the connection point J1 and on its secondary side to a first converter SR1, and a second converter transformer T2, connected on its primary side to the connection point J2 and on its secondary side to a second converter SR2. The converters SR1 and SR2 are mutually connected to a direct-voltage connection PW, through which a direct current Id flows. The direct voltage across the converter SR1 is designated Ud.

Further, the installation comprises a first ac filter F1, connected to the connection point J1 and a second ac filter F2, connected to the connection point J2. The filters serve to filter harmonics generated by the converters and to generate reactive power. The filters comprise sub-filters F11, F12, F13 and F21, F22, F23, respectively, in the figure marked with capacitor symbols only, although the sub-filters designed for filtering purposes are of course, in a known manner, designed as tuned filters comprising also inductive components. The sub-filters F11, F12 and F21, F22, respectively, may, in dependence on a switching order SWO1 and SWO2, respectively, be connected to the respective connection point by means of switching members SW11, SW12 and SW21, SW22, respectively. In a known manner, the converters comprise thyristor valves, the control angles of which, $\alpha1$ and $\alpha2$, respectively, can be controlled relative to the respective alternating voltages. The converter SR1 is controlled by first control equipment CE1 and the converter SR2 by second control equipment CE2 of a similar kind. The two pieces of control equipment communicate with each other via a telecommunication link TL, over which, in a manner known per se, information about operating data and operating orders for the installation can be transmitted. In dependence on supplied, ordered and sensed operating quantities (not shown) for the installation, the control equipment CE1 generates and applies firing pulses CP1, corresponding to an ordered control angle AO1, to the converter SR1 and in similar manner the control equipment CE2 generates and applies firing pulses CP2, corresponding to an ordered control angle AO2, to the converter SR2.

To the connection point J1, the voltage of which is designated U1, a reactive power QN1 flows from the power network N1 and a reactive power QF1 flows from the filter F1, and from the connection point J1 to the converter transformer T1 a reactive power Q1 flows. To the connection point J2, the voltage of which is designated U2, a reactive power QN2 flows from the power network N2 and a reactive power QF2 flows from the filter F2, and from the connection point J2 to the converter transformer T2 a reactive power Q2 flows. The control equipment CE1 is supplied with measured values of the voltage U1, the direct current Id and the ideal no-load direct voltage Udi01 of the converter SR1 by means of members which are known per se but which, in order not to overload the figure with details known to the man skilled in the art, are shown in the figure only as a common measuring means M1 at the converter installation. In a similar manner, the control equipment CE2 is supplied with measured values of the voltage U2, the direct current Id and the ideal no-load direct voltage UdiO2 of the converter SR2, measured by means of a common measuring means M2.

In the following it is assumed that the first converter SR1, in the following designated the rectifier, operates in rectifier operation, whereas the second converter SR2, in the following designated the inverter, operates in inverter operation. The converter installation is controlled, in a manner known per se, in dependence on a power order applied thereto, which at the rectifier, in dependence on the similarly sensed direct voltage Ud, is converted into a current IOL. The rectifier thus controls the direct current Id in dependence on this current order, and the inverter controls the direct voltage Ud of the installation in that a current margin IOM is also applied to the inverter in addition to the current order for the rectifier transmitted via the telecommunication link.

By definition, with the designations stated above, the short-circuit power SSC1 of the first power network is $SSC1=(U1)^2/\omega L1$.

Each one of the sub-filters F11, F12, F13 comprises a capacitor and the filter F1 generates a reactive power $QF1 = (U1)^2 \omega C_{F1}$, where $C_{F1}$ is the sum of the capacitance of the capacitors connected to the connection point J1.

Under the simplifying assumption that the superposition principle applies, that is, that no changes in the power flow to the transformer T1 and the converter SR1 take place during the period under consideration, and the voltage UN1 similarly remains constant, the following calculation can be carried out.

At a certain time, when the filter F1 has the total capacitance $C'_{F1}$ connected to the connection point J1 and generates the reactive power QF1', the following applies:

$$U1=UN1(-1/\omega C'_{F1})/(\omega L_1-1/\omega C'_{F1})=UN1/(1-QF1'/SSC1) \quad (1)$$

A change in the reactive power flow at the connection point J1, for example caused by a switching in the filter F1 which changes its generated reactive power to QF1", then results in a voltage change ΔU1 at the connection point which amounts to $$\Delta U1/UN1=1/[1-(QF1'+\Delta QF1/SSC1]-1/[1-QF1'/SSC1] \quad (2)$$

or $$\Delta U1/UN1=SSC1*\Delta QF1/\{[SSC1-(QF1'+\Delta QF1)]*[SSC1-QF1']\} \quad (3)$$

where $\Delta QF1=QF1"-QF1'$ (b 4)

With equation (1) the following is obtained $$\Delta U1/U1=\Delta QF1/[SSC1-(QF1'+\Delta QF1)] \quad (5)$$

According to the invention, a change in the reactive power flow at the connection point J1 is now achieved by influencing the ordered control angle AO2 of the inverter. The influence consists of the ordered control angle being given a negative ordered control angle addition ΔAO2 corresponding to a (negative) control angle addition Δα2 to the control angle α2 of the inverter. This, in turn, results in a reduction of the direct voltage of the inverter and in an increase in its extinction angle γ and in its reactive power consumption Q2. A reduction of the direct voltage in the dc transmission also initially entails an increase of the direct current Id, which increase via the rectifier is compensated by the control equipment increasing the ordered control angle AO1 of the rectifier and hence the control angle α1 thereof until the active power is restored to its ordered value. The negative ordered control angle addition ΔAO2 at the inverter thus gives rise, at the rectifier, to a positive control angle addition Δα1 to the control angle α1 of the rectifier. This in turn results in an increase of the reactive power consumption Q1 of the rectifier. Provided that, during this procedure, no switching takes place in the filter F1, the influence on the power network N1 thus becomes analogous to the case demonstrated above where the generation of reactive power in the filter F1 was changed, in this case was reduced. The procedure thus leads to an increasing reactive power flow QN1 approximately equal to the increase of the reactive power consumption Q1 of the rectifier, followed by a voltage reduction ΔU1 at the connection point J1. As is realized from the foregoing, a quotient ΔQ1/ΔU1 thus becomes a measure of the short-circuit power of the first power network N1. This quotient can be determined by forming it from calculating values MQ1 and MU1 of the quantities Q1 and U1. A corresponding procedure takes place at the inverter, where thus a quotient ΔQ2/ΔU2 constitutes a measure of the short-circuit power of the second power network N2.

Figure 2:
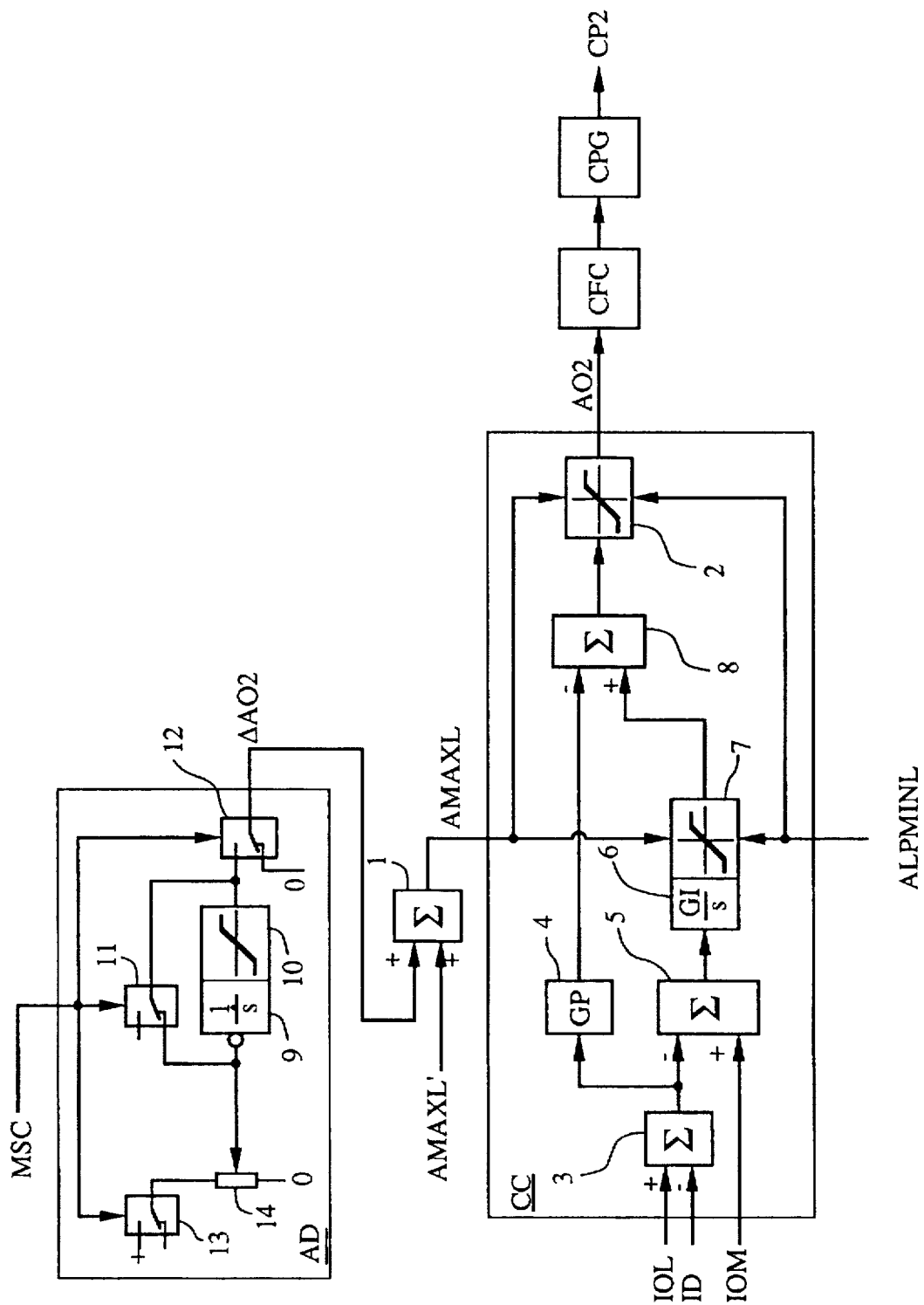
FIG. 2 shows parts of control equipment according to the invention for a converter in an installation according to FIG. 1.

FIG. 2 shows an embodiment of a current controller CC of a known design and an addition-forming means AD according to the invention, comprised in the control equipment CE2 for the inverter. A summator 3 forms as output signal the difference of a reference value IOL for the direct current Id, which reference value is formed in the control equipment of the rectifier and is transmitted to the inverter via the telecommunication link TL, and the value ID of this current measured at the inverter. The difference is supplied to a proportional-amplifying member 4 with a amplification GP and to a summator 5. The summator 5 is also supplied with a preselected current margin IOM between the rectifier and the inverter, and forms as output signal the difference between the current margin and the output signal from the summator 3. The output signal from the summator 5 is supplied to an integrating member with the integration time constant 1/GL. A limiting member 7, comprised in the integrating member, limits the output signal thereof to its maximum and to its minimum value in dependence on limiting signals AMAXL and ALPMINL, respectively. The output signals from the proportional-amplifying member 4 and from the integrating member, limited by the limiting member 7, are supplied to a summator 8. The output signal from the summator 8 is limited in a limiting member 2 to its maximum and to its minimum value in dependence on the limiting signals AMAXL and ALPMINL. The output signal AO2 from the limiting member 2, which constitutes an ordered value of the control angle α2 for the inverter, is supplied to a unit CFC for determining the firing moment of the respective valve and a unit CPG generates at the firing moment control pulses CP2 to the valves included in the inverter .

The current margin IOM is set for the inverter at a value different from zero and with such a sign that the control equipment of the inverter strives to reduce the direct current controlled by the rectifier. In stationary inverter operation, thus, the input signal to the integrating member 6 consists of the current margin, which means that its output signal will assume its maximum value limited by the limiting signal AMAXL. The output signal from the proportional-amplifying member 4 is in equilibrium state equal to zero or near zero, and therefore the value of the control angle α2 ordered by the inverter is determined by the limiting signal mentioned.

The limiting signal AMAXL is formed in a summator 1 as the sum of an operation-limiting signal AMAXL', formed in some manner known per se, and an ordered control-angle addition ΔAO2.

The ordered control-angle addition ΔAO2 is formed in the addition-forming member AD, the function of which is schematically illustrated in the figure.

It comprises an integrating member 9 with a negating input, a switching member 11 which in non-influenced position short-circuits the input and the output of the integrating member, a switching member 12 which in non-influenced position connects a signal equal to zero to the summator 1 and in influenced position connects to this summator the output signal from the integrating member, a switching member 13 which in non-influenced position connects an output signal equal to zero from a signal source 14, illustrated in the figure as a potentionmeter with a movable output, to the input of the integrating member, and in influenced position connects to this input an output signal with a positive sign.

A limiting member 10, comprised in the integrating member 9, limits the output signal thereof to its maximum and to its minimum value. All the switching members mentioned above are influenced in dependence on a control signal MSC in such a way that, when this signal occurs, the ordered control-angle addition ΔAO2 grows linearly from the value zero and, with a negative polarity, is added to the operation-limiting signal AMAXL' in the summator 1. The limiting signal AMAXL thus decreases in its absolute value, which means that the control angle of the inverter decreases linearly with time. The process goes on as long as the control signal MSC occurs (or until the limiting member 10 limits the output signal of the integrating member 9). When the control signal MSC disappears, the output signal of the integrating member and the ordered control-angle addition ΔAO2 again assume the values zero.

Figure 3:
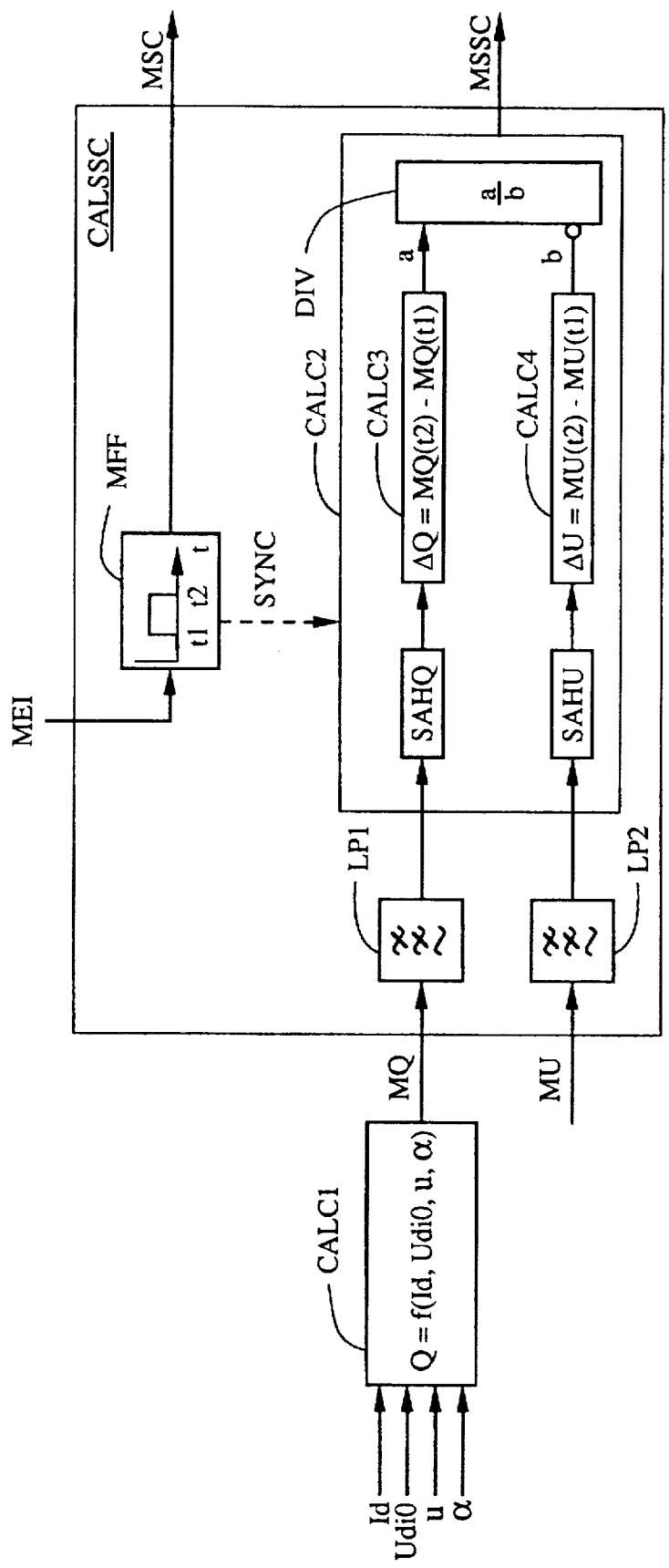
FIG. 3 shows additional parts of control equipment according to the invention in an installation according to FIG. 1.

FIG. 3 schematically illustrates a power calculating member CALC1, which will be described in greater detail below, and a measured-value forming unit CALSSC for forming a measured value of the short-circuit power either of the first and the second power network for alternating current. A calculating member and a measured-value forming unit of this kind are comprised in each one of the pieces of control equipment CE1 and CE2 and it is to be understood that the designations Id, Udi0, u, α, MQ, MU, MSSC, ΔQ and ΔU, as used in the figure, through index 1 and index 2, respectively, not shown in the figure for the sake of clarity, can be referred either to quantities at the first electric power network and the first converter, respectively, or to corresponding quantities at the second electric power network and the second converter, respectively.

The measured-value forming unit CALSSC comprises a monostable circuit MFF, which in dependence on an initiation signal MEI applied thereto, generates the control signal MSC, which is assumed to occur during a measurement interval between a first measurement time t1 and a second measurement time t2. The power calculating member CALC1 is supplied with calculating values of the direct current Id, of the ideal no-load direct voltage Udi0 of the converter, its overlap angle u and its control angle α, which values are determined in some manner known per se. The power calculating member is adapted, in some manner known per se, to continuously calculate, in dependence on the calculating values mentioned above, the reactive power consumed by the converter according to the known expression $$Q=Id*Udi0[2u+\sin 2\alpha-\sin 2(\alpha+u)]/4[\cos \alpha-\cos (\alpha+u)] \qquad (b\ 6)$$

and forms a calculating value MQ of this power.

A calculating member CALC2 comprised in the measured-value forming unit, comprises a first memory member SAHQ, a second memory member SAHU and a first and a second calculating member CALC3 and CALC4, respectively. The calculating values MQ are supplied via a low-pass filtering member LP1 to the memory member SAHQ and are stored therein. Sensed values MU of the voltage U at the connection points J1 and J2 , respectively, are supplied via a low-pass filtering member LP2 to the memory member SAHU and are stored therein. A first power value MQ(t1), constituting the calculating value MQ at the measurement time t1, and a second power value MQ(t2), constituting the calculating value MQ at the measurement time t2, are supplied to the calculating member CALC3, which in some manner known per se is adapted to calculate a power difference ΔQ=MQ(t2)−MQ(t1) of these two power values. A first voltage value MU(t1), constituting the sensed voltage value MU at the measurement time t1, and a second voltage value MU(t2), constituting the sensed voltage value MU at the measurement time t2, are supplied to the calculating member CALC4, which in some manner known per se is adapted to calculate a voltage difference ΔU=MU(t2)−MU(t1) of these two voltage values. A signal SYNC, formed in some manner known per se in the monostable circuit, is adapted to synchronize the function of the memory members SAHQ and SAHU, respectively, such that the respective calculating and sensed values are stored therein at the measurement times t1 and t2. The differences ΔQ and ΔU, respectively, are supplied to a quotient-forming member DIV comprised in the calculating member, whereby, since a positive power difference ΔQ is associated with a negative voltage difference ΔU, the voltage difference ΔU is supplied to a negating input b on the quotient-forming member and the power difference ΔQ is supplied to a non-negating input a. The quotient-forming member forms and delivers as output signal from the measured-value forming unit CALSSC a calculating value MSSC=ΔQ/ΔU, which constitutes a measured value of the short-circuit power for the electric power network for alternating current.

Typically, and to advantage, the duration t2−t1 of the control signal MSC, described with reference to FIG. 3, may be chosen to be of the order of magnitude of 0.5 seconds. This means that the control system of the installation for controlling the direct current, which has a considerably shorter settling time, is capable of maintaining the active power constant during the time when the determination of the short-circuit power continues. The length of the measurement interval, that is, the duration of the control signal MSC, must also be chosen taking into consideration the fact that the pieces of control equipment for the generators present in the ac networks tend to maintain the voltage in the networks. In this context it is also assumed that the control equipment of the inverter does not include any voltage-control system which, during the measurement process, tends to restore the direct voltage thereof with a rapidity which significantly disturbs the measurement.

In the event that the sensing of the voltage U is carried out in a sampled manner, it has proved that a sampling interval of 2 ms gives fully satisfactory accuracy in determining the short-circuit power. The low-pass filtering members LP1 and LP2 are then suitably given a characteristic corresponding to a single time constant of about 10 seconds. The rate of change of the ordered control-angle addition of the inverter, which control-angle addition is formed in the addition-forming member AD, as described with reference to FIG. 2, may, by changing the level of the input signal to the integration member 9, be typically selected in the interval of from 1° to 5°/second.

Figure 4:
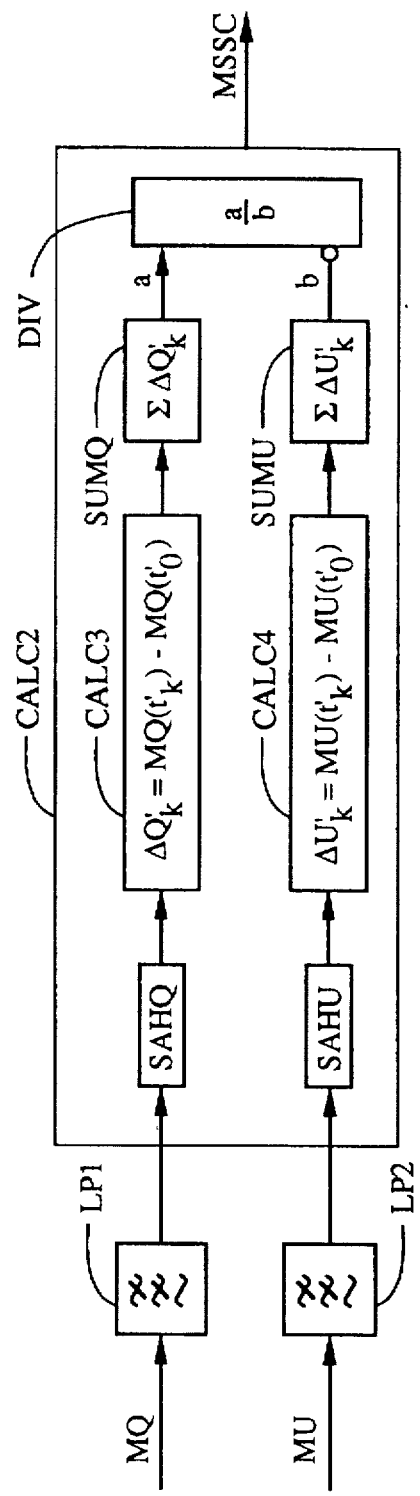
FIG. 4 shows a further embodiment of parts of control equipment according to FIG. 3.

FIG. 4 shows an embodiment of the calculating unit CALC2 in an advantageous improvement of the invention in those cases where the sensing of the voltage U and the calculation of the reactive power Q, in a manner described above, are carried out at a number of sampling times during the measurement time interval t2–t1. Power values MQ and voltage values MU are calculated at a first calculating time $t'_0$ and at least at a second calculating time, generally designated $t'_k$, which lies in a calculating interval between the first calculating time and a last calculating time $t'_n$. Further, it is assumed that the measurement interval, that is, the interval between the measurement times t1 and t2, and the calculating interval, that is, the interval between the calculating times $t'_0$ and $t'_k$, at least partially coincide in time. Especially the first calculating time $t'_0$ may be chosen to coincide with the time t1 when the measurement interval starts and the last calculating time $t'_n$ be chosen to coincide with the time t2 when the measurement interval stops. It is to be understood that, in the method described with reference to FIG. 4, the members comprised in the calculating unit CALC2 carry out their respective operations continuously at each calculating time.

In this embodiment, the memory member SAHQ supplies to the calculating member CALC3 a first power value $MQ(t'_0)$ of the reactive power, calculated at the first calculating time, and a second power value $MQ(t'_k)$, calculated at the second calculating time. In the event that only a first and a second power value are formed, the second power value may be formed at the last calculating time $t'_n$ as the power value $MQ(t'_n)$. The calculating member CALC3 is adapted, in some manner known per se, to form at least a first power difference, generally designated $\Delta Q'_k$, in dependence on the difference of the second and first power values, that is, $\Delta Q'_k = MQ(t'_k) - MQ(t'_0)$. The first power difference is supplied to a power-summation member SUMQ, which forms a sum of all the supplied power differences and applies this sum to the quotient-forming member DIV.

Analogously, the memory member SAHU in this embodiment supplies to the calculating member CALC4 a first voltage value $MU(t'_0)$, sensed at the first calculating time, and a second calculating value $UQ(t'_k)$, sensed at the second calculating time. In the event that only a first and a second voltage value are formed, the second voltage value may be formed at the last calculating time $t'_n$ as the voltage value $MU(t'_n)$. The calculating member CALC4 is adapted, in some manner known per se, to form at least a first voltage difference, generally designated $\Delta U'_k$, in dependence on the difference of the second and first voltage values, that is, $\Delta U'_k = MU(t'_k) - MU(t'_0)$. The first voltage difference is supplied to a voltage summation member SUMU, which forms a sum of all the applied voltage differences and applies this sum to the quotient-forming member DIV. The quotient-forming member forms and thus delivers, in a manner analogous to that described above with reference to FIG. 3, a calculating value $MSSC = \Delta Q'_k / \Delta U'_k$, constituting the quotient of the first power difference and the first voltage difference.

In the event that, at a third calculating time, also located in the calculating interval, a third power value and a third voltage value are formed, the calculating member CALC3 forms a second power difference in dependence on the difference of the third and the first power value and the calculating member CALC4 a second voltage difference in dependence on the difference of the third and the first voltage value. The second power difference is applied to the power summation member SUMQ, which sums the second power difference to the first and supplies the thus formed sum to the quotient-forming member DIV. In an analogous manner, the second voltage difference is supplied to the voltage summation member SUMU, which sums the second voltage difference to the first and supplies the thus formed sum to the quotient-forming member DIV. The quotient-forming member forms and thus continuously delivers a calculating value $MSSC = \Sigma(\Delta Q'_k) / \Sigma(\Delta U'_k)$, constituting the quotient of the respective sum of the first and second power differences and the sum of the first and second voltage differences.

At additional calculating times up to the last calculating time $t'_n$, power and voltage values are calculated, from which are continuously formed power differences of the respective power value and the first power value and voltage differences of the respective voltage value and the first voltage value. The mentioned power and voltage differences are supplied continuously to associated summation members, whereby the sums formed thereby are continuously supplied to the quotient-forming member. This member forms and thus delivers continuously during the calculating interval the calculating value $MSSC = \Sigma(\Delta Q'_k) / \Sigma(\Delta U'_k)$, constituting the quotient of the respective sum of applied power differences and the sum of applied voltage differences.

The summation members SUMQ and SUMU are reset, in a manner not shown in the figures, before each new measurement period.

The initiation signal MEI can be formed either at the site where the inverter is located or at the site where the rectifier is located, whereby, in the latter case, it is transferred to the site of the inverter via the telecommunication link TL. The telecommunication link can, of course, also be utilized for transmitting the measured value MSSC of the short-circuit power between the sites of the inverter and the rectifier, respectively. The initiation signal can be activated manually by an operator or, for example, at regular time intervals or in dependence on received information about a change of the operating position of the power networks.

The invention is not limited to the embodiments shown but a plurality of modifications are feasible within the inventive concept. The limiting members, the calculating units and the function-forming members shown in the block diagrams may, in applicable parts, be designed as models comprising analog and/or digital means for the modelling or be carried out completely or partially as calculations by means of analog and/or digital technique in hard-wired circuits, or be implemented as programs in microprocessors.

It is self-evident that either, or both, of the power and voltage differences utilized for the determination of the short-circuit power may be formed as differences of the respective power and voltage values at the first and the second measurement time, respectively.

The summation member SUMQ and the voltage summation member SUMU, described with reference to FIG. 4, are of course not necessary when the method and the device, respectively, are applied to only a first and a second calculating time.

Although the ordered control-angle addition, described with reference to FIG. 2, is advantageously formed as linearly growing in its absolute value in the measurement interval between the first and the second measurement time, it may also, of course, be formed with other variations in time, with start and stop at the limits of the measurement interval or in the interior of the measurement interval.

It is also to be understood that, at a given voltage, measurement of short-circuit power is equivalent to measurement of the impedance of the power network.

The measured value MSSC of the short-circuit power thus obtained can be used in the superordinate control of the installation. Upon an order for switching of a filter, for example caused by a switching of the power network for the alternating current corresponding to a change $\Delta QF$ of its generated reactive power, the converter may be given a control-angle addition formed in dependence on the short-circuit power in question, which control-angle addition after the switching may be reduced to zero during a controlled process in order thus to minimize disturbances in the voltages U1 and U2, respectively. In case of, for example, a planned disconnection of part of a filter, corresponding to a disconnection of the reactive power $\Delta QF$, a reduction of the control angle of the inverter can be initiated in the way described above while continuously sensing the power difference $\Delta Q(t)-MQ(t)=MQ(t'_0)$. When this difference is equal to the value $\Delta QF$, the signal MSC is caused to cease and the filter part corresponding to the reactive power $\Delta QF$ can be disconnected with minimum disturbance of the voltage U1 and U2. Inversely, a voltage change at the connection point J1 and J2, respectively, caused by, for example, a switching in the respective power network, together with the measured value MSSC provides information as to how much of the reactive power generation of the filter connected to the respective connection point, via the switching order SWO1 and SWO2, respectively, is to be changed in order for the voltage to be restored to the previous level.

I claim:

1. A method for determining short-circuit power (SCC1, SCC2) in an electric power network (N1, N2) for alternating current, which at a connection point (J1, J2) is connected to a converter installation (PL) for transmission of high-voltage direct current, wherein a converter (SR1, SR2) comprised in the converter installation is connected to the power network, said converter operating with a control angle ($\alpha 1$, $\alpha 2$) in dependence on an ordered control angle (AO1, AO2), ordered by control equipment (CE1, CE2), wherein at a first calculating time ($t'_0$), a first power value (MQ($t'_0$)), of reactive power (Q1, Q2) consumed by the converter, is formed and stored, the voltage (U1, U2) of the power network at the connection point is sensed, and a first voltage value (MU($t'_0$)) of said voltage is formed and stored, at at least one second calculating time ($t'_k$, $t'_n$), a second power value (MQ($t'_k$), MQ($t'_n$)) is formed and stored, the voltage of the power network at the connection point is sensed and a second voltage value (MU($t'_k$), MU($t'_n$)) of said voltage is formed and stored, whereby the second calculating time lies in a calculating interval ($t'_0-t'_n$) between the first and a last calculating time($t'_n$), and during a measurement interval (t1–t2) between a first measurement time (t1) and a second measurement time (t2), which measurement interval at least partly coincides with the calculating interval, the control angle ($\alpha 1$, $\alpha 2$) of the converter is given a control-angle addition ($\Delta\alpha 1$, $\Delta\alpha 2$), a first power difference ($\Delta Q'_k$) is formed in dependence on the difference of the first and second power values, a first voltage difference ($\Delta U'_k$) is formed in dependence on the difference of the first and second voltage values, and a measured value (MSSC1, MSSC2) of the short-circuit power of the power network is formed in dependence on the first power difference and the first voltage difference.

2. A method according to claim 1, wherein at least at a third calculating time ($t'_k$, $t'_n$) in the calculating interval, a third power value (MQ($t'_k$), MQ($t'_n$)) and a third voltage value (MU($t'_k$), MU($t'_n$)) are formed and stored, a second power difference ($\Delta Q'_k$) is formed in dependence on the difference of the first and third power values, a second voltage difference ($\Delta U'_k$) is formed in dependence on the difference of the first and third voltage values, the first and second power differences are summed into a power sum ($\Sigma(\Delta Q'_k)$), the first and second voltage differences are summed into a voltage sum ($\Sigma(\Delta U'_k)$), and a measured value of the short-circuit power of the power network is formed in dependence on the power sum and the voltage sum.

3. A method according to claim 2, wherein the measured value of the short-circuit power of the power network is formed in dependence on a quotient of the power sum and the voltage sum.

4. A method according to claim 1, wherein the first calculating time and the first measurement time and the last calculating time and the second measurement time, respectively, are caused to coincide.

5. A method according to claim 1, wherein the power values are formed by a calculation based on the values of direct current (Id) flowing through the converter, the ideal no-load direct voltage (Udi0) of the converter, the overlap angle (u) of the converter, and the control angle ($\alpha$) of the converter, said values occurring at the respective calculating times.

6. A method according to claim 1, wherein the converter installation comprises a first converter (SR1) connected to a first electric power network (N1) for alternating current, and a second converter (SR2) connected to a second electric power network (N2) for alternating current and said converters are mutually connected to a direct-voltage connection (PW) and the second converter operates in inverter operation in dependence on an ordered control angle (AO2), wherein the control-angle addition ($\Delta\alpha 1$, $\Delta\alpha 2$) is formed by giving the ordered control angle of the second converter a negatively ordered control-angle addition ($\Delta AO2$).

7. A method according to claim 6, wherein the ordered control-angle addition is formed with an absolute value which grows linearly with time during the measurement interval.

8. A device for determining short-circuit power (SCC1, SCC2) in an electric power network (N1, N2) for alternating current, which at a connection point (J1, J2) is connected to a converter installation (PL) for transmission of high-voltage direct current, wherein a converter (SR1, SR2) comprised in the converter installation is connected to the power network, said converter operating with a control angle ($\alpha 1$, $\alpha 2$) in dependence on an ordered control angle (AO1, AO2), ordered by control equipment (CE1, CE2), wherein an addition-forming member (AD), which in dependence on a control signal (MSC), which occurs during a measurement interval (t1–t2) between a first measurement time (t1) and a second measurement time (t2), forms a control-angle addition ($\Delta\alpha 1$, $\Delta\alpha 2$) to the control angle ($\alpha 1$, $\alpha 2$) of the converter, measuring means (M1, M2) sensing the voltage (U1, U2) of the power network at the connection point, which forms a first voltage value (MU(t'$_0$)) of said voltage at a first calculating time (t'$_0$) and at least a second calculating time (t'$_k$, t'$_n$) forms a second voltage value (MU(t'$_k$), MU(t'$_n$)) of said voltage, a power calculating member (CALC1) which forms a first power value (MQ(t'$_0$)), of reactive power (Q1, Q2) consumed by the converter, at the first calculating time and at least at the second calculating time forms a second power value (MQ(t'$_k$), MQ(t'$_n$)), the second calculating time lying in a calculating interval (t'$_0$–t'$_n$) between the first calculating time and a last calculating time (t'$_n$), and the measurement interval at least partially coincides with the calculating interval, a calculating unit (CALC2) which is supplied with the first and second voltage values and the first and second power values, respectively, and forms a first power difference ($\Delta Q'_k$) in dependence on the difference of the first and second power values, a first voltage difference ($\Delta U'_k$) in dependence on the difference of the first and second voltage values, and a measured value (MSSC1, MSSC2) of the short-circuit power of the power network in dependence on the first power difference and the first voltage difference.

9. A device according to claim 8, wherein at least at a third calculating time (t'$_k$, t'$_n$) in the calculating interval, the measuring means form a third voltage value (MU(t'$_k$), MU(t'$_n$)) and the power calculating members form a third power value, and the calculating unit forms a second power difference ($\Delta Q'_k$) in dependence on the difference of the first and third power values, a second voltage difference ($\Delta U'_k$) in dependence on the difference of the first and third voltage values, and sums the first and second power differences into a power sum ($\Sigma(\Delta Q'_k)$), and sums the first and second voltage differences into a voltage sum ($\Sigma(\Delta U'_k)$), and forms the measured value of the short-circuit power of the power network in dependence on the power sum and the voltage sum.

10. A device according to claim 9, wherein the calculating unit forms the measured value of the short-circuit power of the power network in dependence on a quotient of the power sum and the voltage sum.

11. A device according to claim 8, wherein it causes the first calculating time and the first measurement time and the last calculating time and the second measurement time to coincide.

12. A device according to claim 8, wherein the power calculating member (CALC1) continuously calculates said power values from values of the direct current (Id) flowing through the converter, the ideal no-load direct voltage (UdiO) of the converter, the overlap angle (u) of the converter and the control angle ($\alpha$) of the converter, said values occurring at the respective calculating times.

13. A device according to claim 8 wherein the converter installation comprises a first converter (SR1 connected to a first electric power network (N1) for alternating current and a second converter (SR2), connected to a second electric power network (N2) for alternating current and said converters are mutually connected to a dc line (PW) and the second converter operates in inverter operation in dependence on an ordered control angle (AO2), wherein the addition-forming member (AD) forms the control-angle addition ($\Delta\alpha 1$, $\Delta\alpha 2$) to the control angle ($\alpha 1$, $\alpha 2$) of the converter by adding to the ordered control angle (AO2) of the second converter a negatively ordered control-angle addition ($\Delta AO2$).

14. A device according to claim 13, wherein the addition-forming member forms the ordered control-angle addition to the control angle with an absolute value growing linearly with time during the measurement interval.

* * * * *